(12) United States Patent
Chung et al.

(10) Patent No.: US 7,948,167 B2
(45) Date of Patent: May 24, 2011

(54) ORGANIC LIGHT EMITTING DEVICE AND MANUFACTURING METHOD THEREOF

(75) Inventors: Jin-Koo Chung, Suwon-si (KR); Dong-Won Lee, Seongnam-si (KR); Chang-Woong Chu, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 323 days.

(21) Appl. No.: 12/267,903

(22) Filed: Nov. 10, 2008

(65) Prior Publication Data

US 2009/0256477 A1    Oct. 15, 2009

(30) Foreign Application Priority Data

Apr. 14, 2008 (KR) .................. 10-2008-0034288

(51) Int. Cl.
*H01J 1/62* (2006.01)
*H01J 63/04* (2006.01)
(52) U.S. Cl. .......................................... 313/504; 445/24
(58) Field of Classification Search .................. 313/504, 313/505; 445/24, 49
See application file for complete search history.

(56) References Cited

U.S. PATENT DOCUMENTS

| 7,622,738 B2* | 11/2009 | Oh et al. ........................... 257/59 |
| 2005/0093432 A1* | 5/2005 | Yamazaki et al. ............. 313/503 |
| 2006/0097623 A1* | 5/2006 | Abe et al. ........................ 313/498 |
| 2007/0018150 A1* | 1/2007 | Nakajima et al. ................ 257/10 |
| 2008/0100203 A1* | 5/2008 | Sakai .............................. 313/504 |
| 2008/0157655 A1* | 7/2008 | Choi et al. ..................... 313/504 |
| 2008/0169757 A1* | 7/2008 | Chang et al. ................... 313/504 |
| 2008/0290790 A1* | 11/2008 | Jin ................................. 313/504 |
| 2008/0303420 A1* | 12/2008 | Uchida .......................... 313/504 |
| 2009/0066237 A1* | 3/2009 | Kambe et al. .................. 313/504 |
| 2009/0200544 A1* | 8/2009 | Lee et al. ......................... 257/40 |

\* cited by examiner

*Primary Examiner* — Nimeshkumar D Patel
*Assistant Examiner* — Glenn Zimmerman
(74) *Attorney, Agent, or Firm* — H.C. Park & Associates, PLC (57) ABSTRACT

The present invention relates to an organic light emitting device including a substrate, a first pixel electrode disposed on the substrate, a second pixel electrode disposed on the first pixel electrode and having a groove, a partition disposed on the second pixel electrode and having an opening exposing the groove, an organic light emitting member, and a common electrode disposed on the partition and the organic light emitting member. At least a portion of the organic light emitting member is disposed in the groove. The partition overlaps the groove to form a gap, and at least a portion of the organic light emitting member is disposed in the gap.

24 Claims, 11 Drawing Sheets

ORGANIC LIGHT EMITTING DEVICE AND MANUFACTURING METHOD THEREOF

CROSS-REFERENCE TO RELATED APPLICATION

This application claims priority from and the benefit of Korean Patent Application No. 10-2008-0034288, filed on Apr. 14, 2008, which is hereby incorporated by reference for all purposes as if fully set forth herein.

BACKGROUND OF THE INVENTION

1. Field of the Invention

The present invention relates an organic light emitting device and a manufacturing method thereof.

2. Discussion of the Background

An active matrix flat panel display generally includes a plurality of pixels to display images, and it displays the images by controlling the luminance of each pixel according to given information. Among such active matrix flat panel display devices, an organic light emitting display is a self-emissive display device having low power consumption, a wide viewing angle, and a high response speed, so the organic light emitting display is being spotlighted as a next-generation display device to surpass the liquid crystal display (LCD).

The organic light emitting device includes an organic light emitting element, that is, two electrodes with an emission layer disposed therebetween. Electrons injected from one of the electrodes and holes injected from the other electrode are combined in the light emitting layer to form excitons, and the excitons release energy, thereby causing light to be emitted.

The organic light emitting device also includes a driving transistor to drive the organic light emitting element and a switching transistor to apply data voltages to the driving transistor, and the transistors may be thin film transistors (TFTs).

In the organic light emitting device, to realize excellent emitting characteristics, the emission layer disposed between two electrodes should be uniformly formed, and furthermore a leakage current should not be generated.

However, it may be difficult to uniformly form the emission layer due to surface tension of the emission layer, and furthermore, the emission layer may not cover the electrodes so a leakage current may be generated. When the emission layer is not uniform or a leakage current is generated, a luminance deviation may occur, or the luminance may be deteriorated.

SUMMARY OF THE INVENTION

The present invention provides an organic light emitting device and a manufacturing method thereof to uniformly form the emission layer and to prevent leakage current.

Additional features of the invention will be set forth in the description which follows, and in part will be apparent from the description, or may be learned by practice of the invention.

The present invention discloses an organic light emitting device including a substrate, a first pixel electrode disposed on the substrate, a second pixel electrode disposed on the first pixel electrode and having a groove, a partition disposed on the second pixel electrode and having an opening exposing the groove, an organic light emitting member with at least a portion thereof disposed in the groove, and a common electrode disposed on the partition and the organic light emitting member. The partition overlaps the groove to form a gap, and at least a portion of the organic light emitting member is disposed in the gap.

The present invention also discloses a manufacturing method of an organic light emitting device including forming a first pixel electrode on a substrate, forming a second pixel electrode including a different material from the material of the first pixel electrode on the first pixel electrode, forming a partition having an opening on the second pixel electrode, etching the second pixel electrode by forming a groove forming a gap under the partition, forming an organic light emitting member in the groove to fill at least a portion of the gap, and forming a common electrode on the organic light emitting member and the partition.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

An organic light emitting device according to an exemplary embodiment of the present invention will be described in detail below with reference to FIG. 1.

Figure 1:
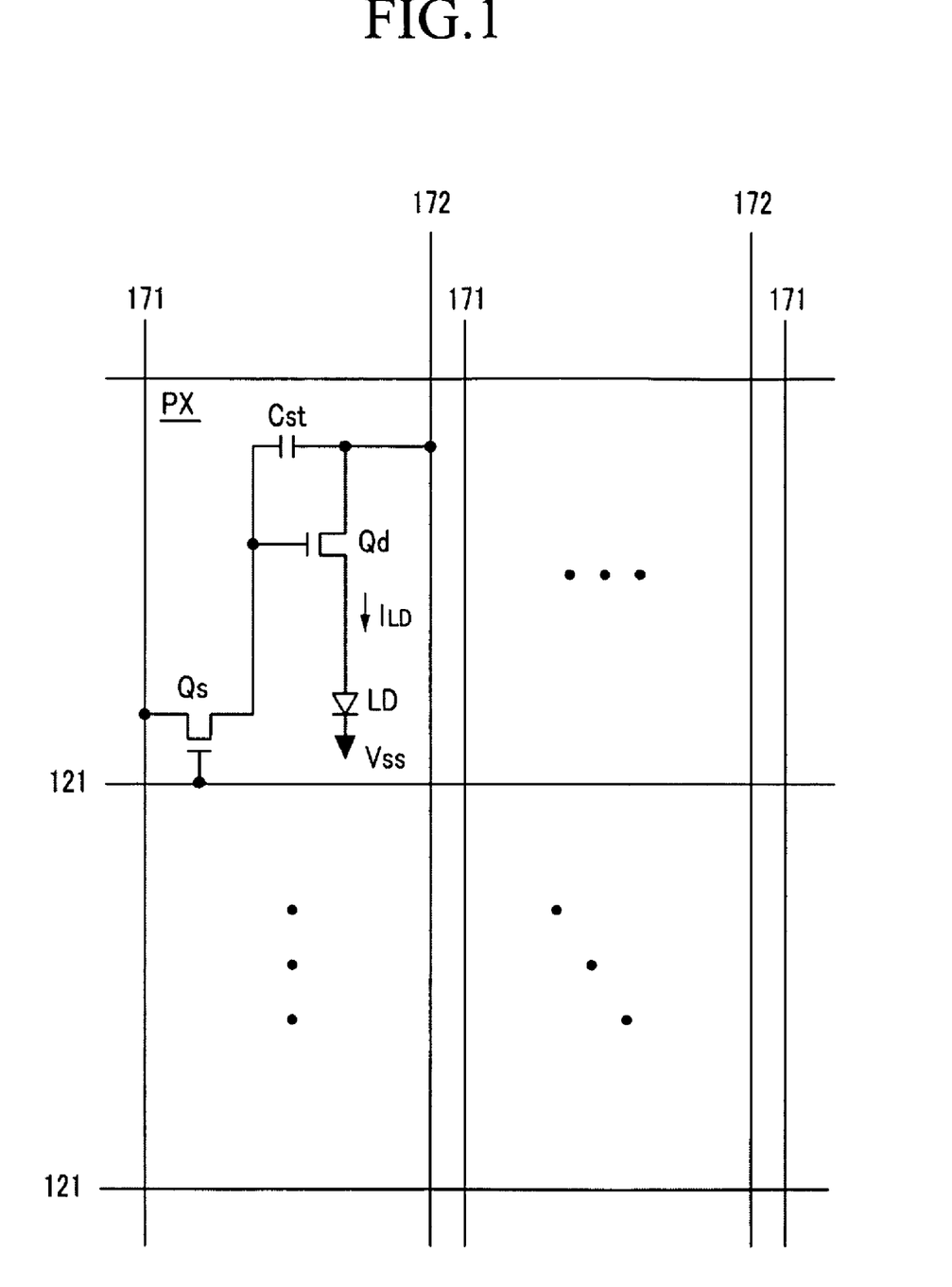
FIG. 1 is an equivalent circuit diagram of an organic light emitting device accordingly an exemplary embodiment of the present invention.

FIG. 1 is an equivalent circuit diagram of an organic light emitting device according to an exemplary embodiment of the present invention.

Referring to FIG. 1, an organic light emitting device according to the present exemplary embodiment includes a plurality of signal lines 121, 171, and 172, and a plurality of pixels PX connected thereto and arranged substantially in a matrix.

The signal lines include a plurality of gate lines 121 to transmit gate signals (or scanning signals), a plurality of data lines 171 to transmit data signals, and a plurality of driving voltage lines 172 to transmit a driving voltage. The gate lines 121 extend substantially in a row direction and substantially parallel to each other, and the data lines 171 and the driving voltage lines 172 extend substantially in a column direction and substantially parallel to each other.

Each pixel PX includes a switching transistor Qs, a driving transistor Qd, a storage capacitor Cst, and an organic light emitting element. The organic light emitting element functions as an organic light emitting diode (OLED) LD.

The switching transistor Qs has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting diode LD. The driving transistor Qd drives an output current $I_{LD}$ having a magnitude depending on the voltage between the control terminal and the input terminal thereof.

The storage capacitor Cst is connected between the control terminal and the input terminal of the driving transistor Qd. The storage capacitor Cst stores a data signal applied to the control terminal of the driving transistor Qd and maintains the data signal after the switching transistor Qs turns off.

The organic light emitting diode LD has an anode connected to the output terminal of the driving transistor Qd and a cathode connected to a common voltage $V_{SS}$. The organic light emitting diode LD emits light having an intensity depending on an output current $I_{LD}$ of the driving transistor Qd, thereby displaying images.

The switching transistor Qs and the driving transistor Qd may be n-channel field effect transistors (FETs). However, at least one of the switching transistor Qs and the driving transistor Qd may be a p-channel FET. In addition, the connections among the transistors Qs and Qd, the capacitor Cst, and the organic light emitting diode LD may be modified.

Now, the structure of the organic light emitting device shown in FIG. 1 will be described in detail with reference to FIG. 2, FIG. 3, and FIG. 4.

Figure 2:
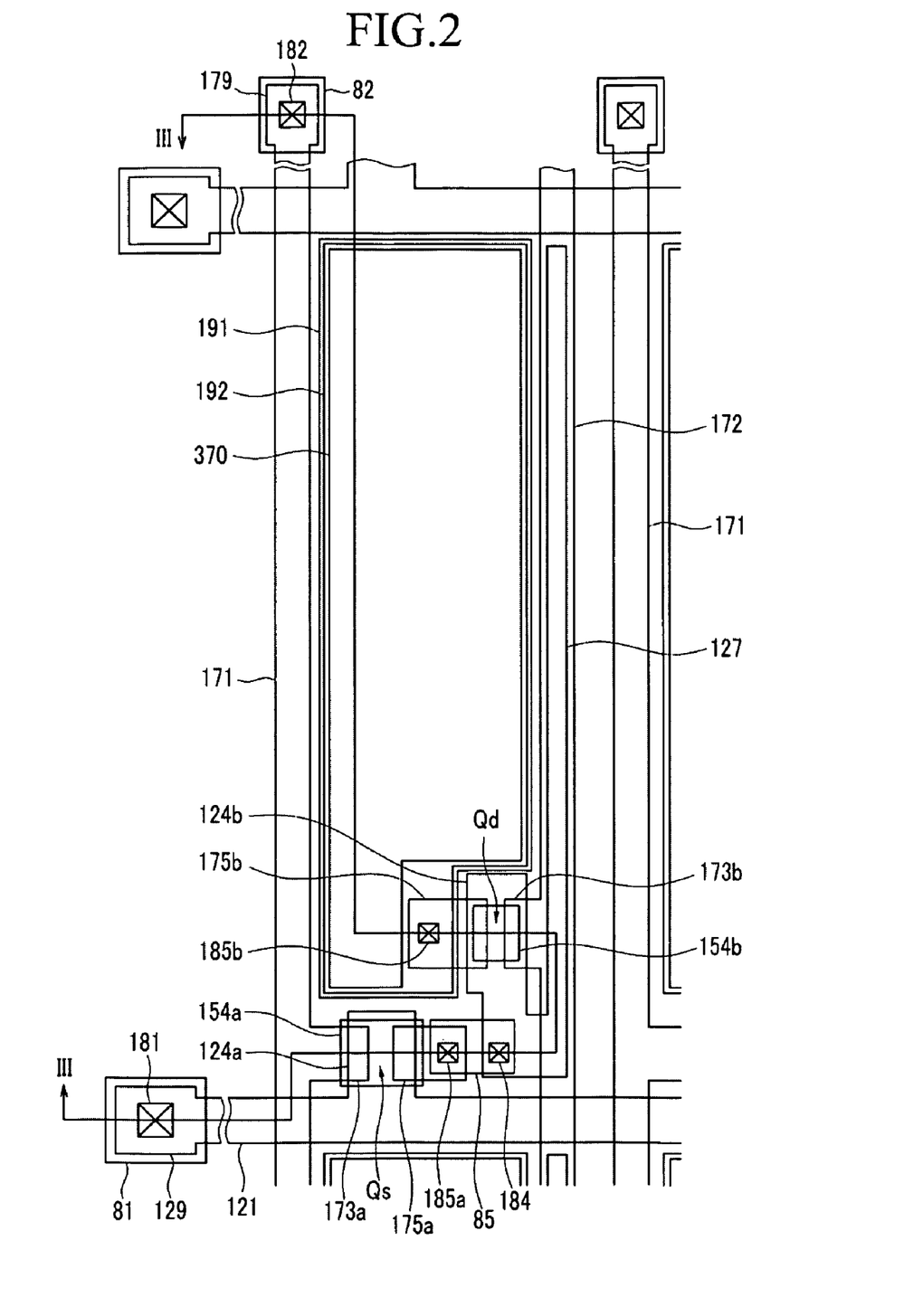
FIG. 2 is a layout view of an organic light emitting device according to an exemplary embodiment of the present invention.
Figure 3:
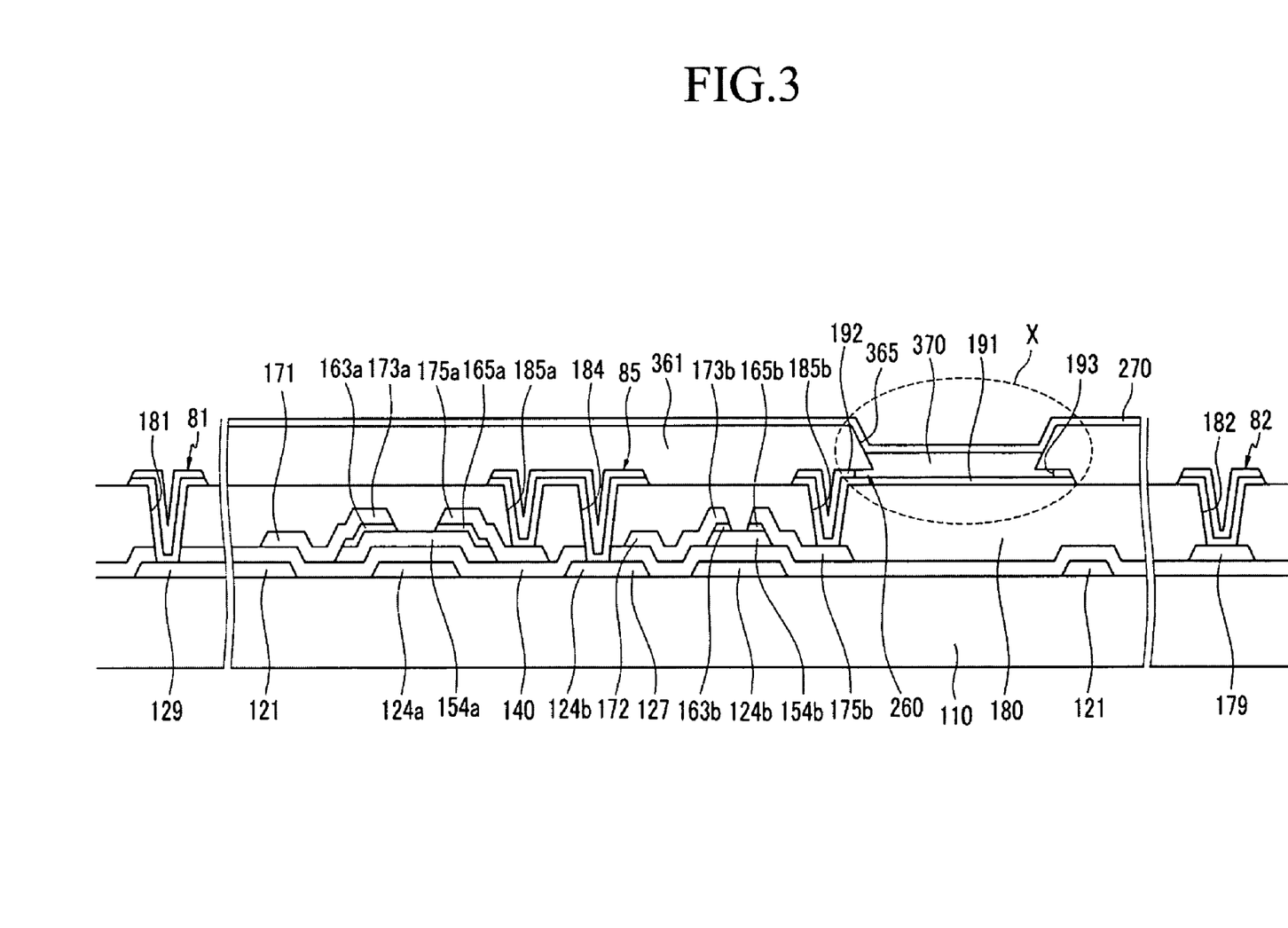
FIG. 3 is a cross-sectional view of the organic light emitting device shown in FIG. 2 taken along line III-III according to an exemplary embodiment of the present invention.
Figure 4:
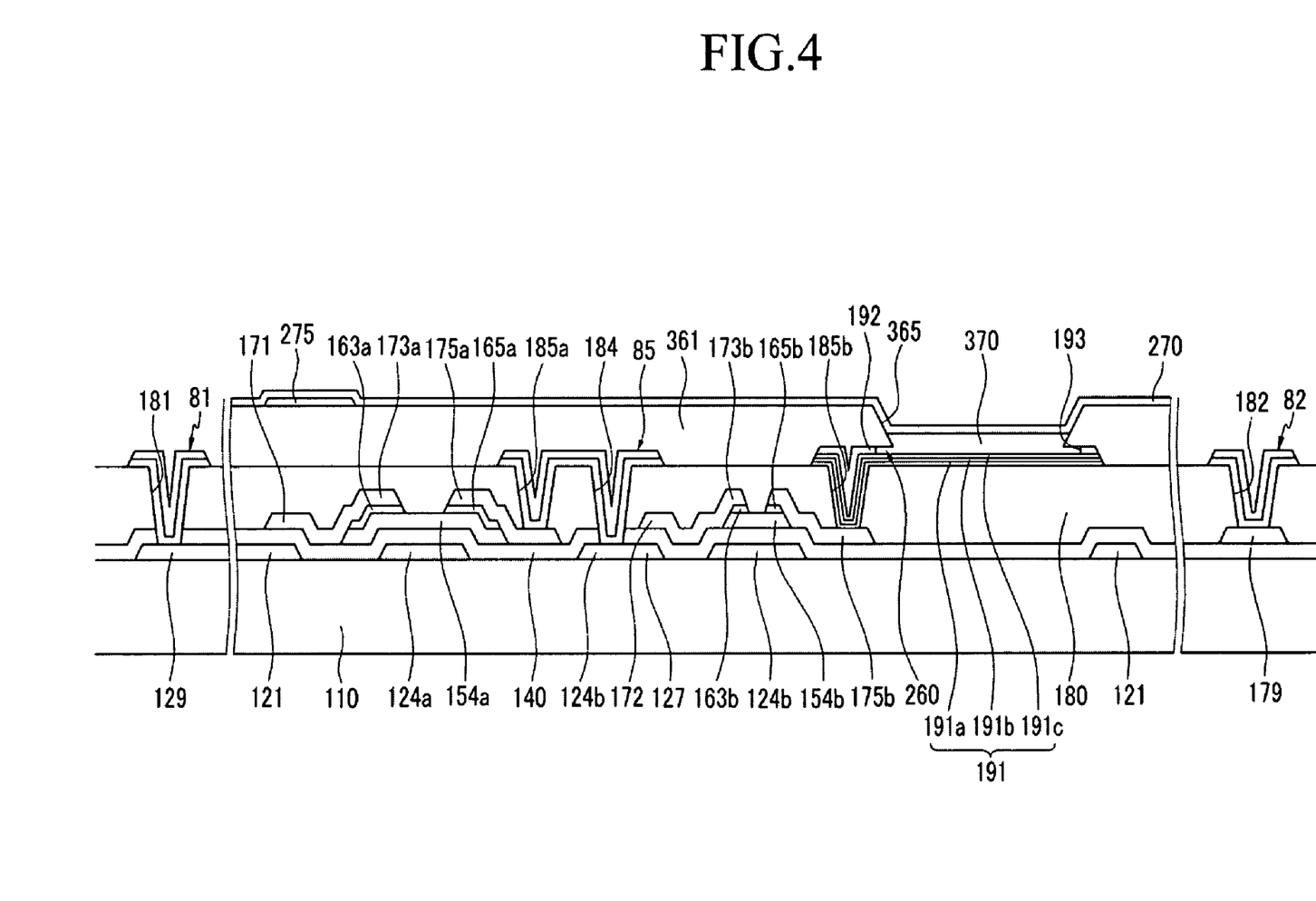
FIG. 4 is a cross-sectional view of the organic light emitting device shown in FIG. 2 taken along line III-III according to another exemplary embodiment of the present invention.

FIG. 2 is a layout view of an organic light emitting device according to an exemplary embodiment of the present invention, FIG. 3 is a cross-sectional view of the organic light emitting device shown in FIG. 2 taken along line III-III according to an exemplary embodiment of the present invention, and FIG. 4 is a cross-sectional view of the organic light emitting device shown in FIG. 2 taken along line III-III according to another exemplary embodiment of the present invention.

A plurality of gate conductors including a plurality of gate lines 121 including a plurality of first control electrodes 124a and a plurality of second control electrodes 124b are formed on an insulating substrate 110.

The gate lines 121 transmit gate signals and extend substantially in the transverse direction. Each gate line 121 includes an end portion 129 having a large area for contact with another layer or an external driving circuit, and the first control electrodes 124a extend upward from the gate lines 121. The second control electrodes 124b are spaced apart from the gate lines 121 and include a plurality of storage electrodes 127 extending in one direction.

A gate insulating layer 140, which may be made of silicon nitride ($SiN_x$) or silicon oxide ($SiO_2$), is formed on the gate conductors 121, 124a, 124b, and 127.

A plurality of first semiconductors 154a and a plurality of second semiconductors 154b, which may be made of hydrogenated amorphous silicon (a-Si) or polysilicon, are formed on the gate insulating layer 140. The first semiconductors 154a overlap the first control electrodes 124a and the second semiconductors 154b overlap the second control electrodes 124b.

A plurality of pairs of first ohmic contacts 163a and 165a and a plurality of pairs of second ohmic contacts 163b and 165b are respectively formed on the first and second semiconductors 154a and 154b. The first ohmic contacts 163a and 165a are disposed in pairs on the first semiconductors 154a, and the second ohmic contacts 163b and 165b are disposed in pairs on the second semiconductors 154b.

A plurality of data conductors including a plurality of data lines 171, a plurality of driving voltage lines 172, and a plurality of first and second output electrodes 175a and 175b are formed on the ohmic contacts 163a, 163b, 165a, and 165b, and on the gate insulating layer 140.

The data lines 171 transmit data signals and extend in a longitudinal direction while crossing the gate lines 121. Each data line 171 includes a plurality of first input electrodes 173a extending toward the first control electrodes 124a and an end portion 179 having a large area for contact with another layer or an external driving circuit.

The driving voltage lines 172 transmit driving voltages and extend in the longitudinal direction while crossing the gate lines 121. Each driving voltage line 172 includes a plurality of second input electrodes 173b extending toward the second control electrodes 124b and a portion overlapped with the storage electrodes 127.

The first and second output electrodes 175a and 175b are spaced apart from each other, and are spaced apart from the data lines 171 and the driving voltage lines 172. The first input electrodes 173a and the first output electrodes 175a are opposite to each other with respect to the first control electrodes 124a, and the second input electrodes 173b and the second output electrodes 175b are opposite to each other with respect to the second control electrodes 124b.

The data conductors 171, 172, 175a, and 175b may be made of a refractory metal such as molybdenum, chromium, tantalum, titanium, or alloys thereof.

The ohmic contacts 163a, 163b, 165a, and 165b are disposed between the semiconductors 154a and 154b and the data conductors 171, 172, 175a, and 175b to reduce contact resistance therebetween. The semiconductors 154a and 154b include a portion between the input electrodes 173a and 173b and the output electrodes 175a and 175b, and the exposed portions by the data conductors 171, 172, 175a, and 175b.

A passivation layer 180 is formed on the data conductors 171, 172, 175a, and 175b, and the exposed semiconductors 154a and 154b. The passivation layer 180 may be made of an inorganic insulator or an organic insulator and has a flat surface.

The passivation layer 180 has a plurality of contact holes 182, 185a, and 185b respectively exposing the end portions 179 of the data lines 171, and the first and second output electrodes 175a and 175b, and the passivation layer 180 and the gate insulating layer 140 have a plurality of contact holes 181 and 184 respectively exposing the end portions 129 of the gate lines 121 and the second input electrodes 124b.

A plurality of first and second pixel electrodes 191 and 192, a plurality of connecting members 85, and a plurality of contact assistants 81 and 82, which may have a double-layered structure, are formed on the passivation layer 180.

The first pixel electrode 191 and the second pixel electrode 192 may be made of different materials. For example, the first pixel electrode 191 may be made of indium tin oxide (ITO), and the second pixel electrode 192 may be made of indium zinc oxide (IZO).

Furthermore, the first pixel electrode 191 may have a multi-layered structure. For example, as shown in FIG. 4, the first pixel electrode 191 may include a first layer 191a of ITO, a second layer 191b, which may be made of a metal such as aluminum, formed on the first layer 191a, and a third layer 191c, which may be made of ITO, formed on the second layer 191b. In the case of a top emission device, the second layer 191b may function as a reflective layer.

The second pixel electrode 192 includes a groove 193. The groove 193 passes through the second pixel electrode 192 to expose the first pixel electrode 191. However, the groove 193 of the second pixel electrode 192 does not have to pass therethrough, and may alternatively be a groove that is concave in the second pixel electrode 192.

The connecting members 85 are connected to the second control electrodes 124b and the first output electrodes 175a through the contact holes 184 and 185a, and the contact assistants 81 and 82 are connected to the end portions 129 and 179 through the contact holes 181 and 182, respectively. The connecting members 85 and the contact assistants 81 and 82 have a double-layered structure and may include a transparent conductive material such as ITO and IZO, or a reflective metal such as aluminum, silver, or alloys thereof.

Partitions 361 are formed on the passivation layer 180. The partitions 361 define a plurality of openings 365 enclosing edges of the pixel electrodes 191, and may be made of an organic insulator or an inorganic insulator. The partitions 361 may be made of a photosensitive material including a black pigment, and the partitions 361 function as light blocking members in this case.

The partitions 361 form a plurality of gaps 260 overlapping the groove 193 of the second pixel electrode 192, and a plurality of organic light emitting members 370 are disposed between the gaps 260 and the openings 365. That is, the gaps 260 overlap the first pixel electrodes 191 and the partitions 361, and are provided at positions where the second pixel electrodes 192 do not exist.

A common electrode 270 is formed on the organic light emitting members 370. The common electrode 270 may be made of a metal such as magnesium (Mg) and silver (Ag). In the case of a bottom emission device, the common electrode 270 should be made of a reflective metal to reflect light. However, in the case of the top emission type, the light passes through the common electrode 270 such that the common electrode 270 is thin. When the common electrode 270 is thin, the resistance thereof may be increased such that an auxiliary electrode 275 may be formed between the partition 361 and the common electrode 270, as shown in FIG. 4. The auxiliary electrode 275 may be made of a low resistance metal such as copper, silver, and aluminum, and may be disposed on one or more of the gate lines 121, the data lines 171, and the driving voltage lines 172.

An encapsulation layer (not shown) may be formed on the common electrode 270. The encapsulation layer encapsulates the organic light emitting member 370 and the common electrode 270 to prevent moisture penetration and/or oxidization.

In the organic light emitting device, the first control electrode 124a connected to the scanning signal 121, the first input electrode 173a connected to the data line 171, and the first output electrode 175a form a switching thin film transistor Qs along with the semiconductor 154a, and the channel of the switching thin film transistor Qs is formed in the semiconductor 154a between the first input electrode 173a and the first output electrode 175a. The second control electrode 124b connected to the first output electrode 175a, the second input electrode 173b connected to the driving voltage line 172, the second output electrode 175b connected to the pixel electrode 191, and the semiconductor 154b form the driving thin film transistor Qd, and the channel of the driving thin film transistor Qd is formed in the semiconductor 154b between the second input electrode 173b and the second output electrode 175b.

A pixel electrode 191, an organic light emitting member 370, and the common electrode 270 form an organic light emitting element having the pixel electrode 191 as an anode and the common electrode 270 as a cathode, or vice versa. Also, the storage electrode 127 and the driving voltage line 172 that overlap each other to form a storage capacitor Cst.

The control electrodes 124a and 124b may alternatively be disposed on the semiconductors 154a and 154b, and the gate insulating layer 140 is disposed between the semiconductors 154a and 154b and the control electrodes 124a and 124b in this case. Here, the data conductors 171, 172, 173b, and 175b may be disposed on the gate insulating layer 140, and may be connected to the semiconductors 154a and 154b through a contact hole (not shown) formed in the gate insulating layer 140. Alternatively, the data conductors 171, 172, 173b, and 175b may be disposed under the semiconductors 154a and 154b and may contact the semiconductors 154a and 154b.

The partition 361, the gaps 260, and the organic light emitting members 370 will be described in detail with reference to FIG. 5, FIG. 6, and FIG. 7.

Figure 5:
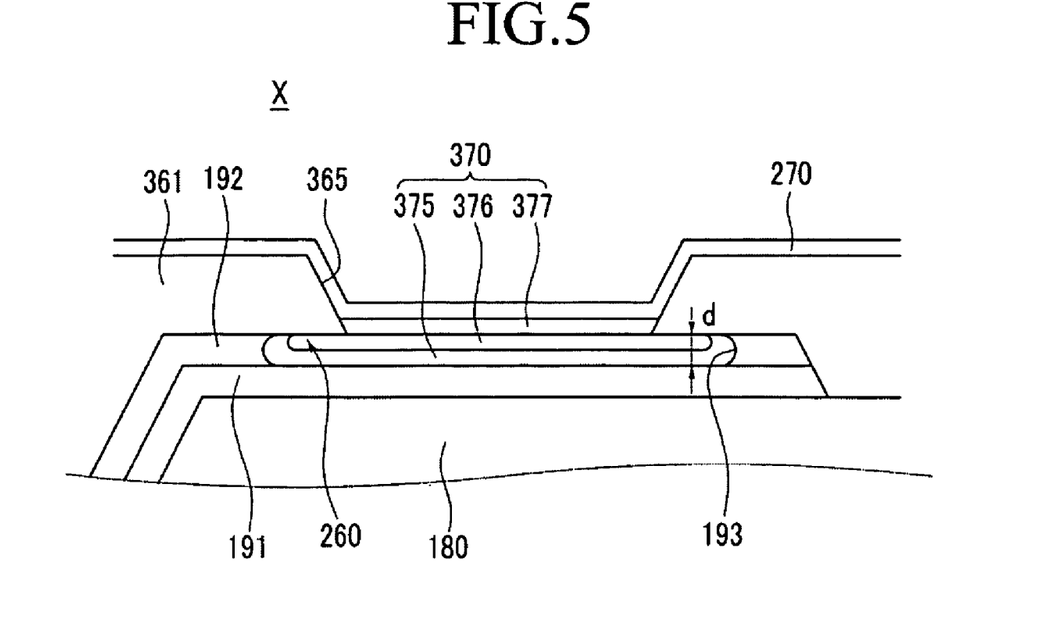
FIG. 5 is an enlarged view of portion X of the organic light emitting device shown in FIG. 3.
Figure 6:
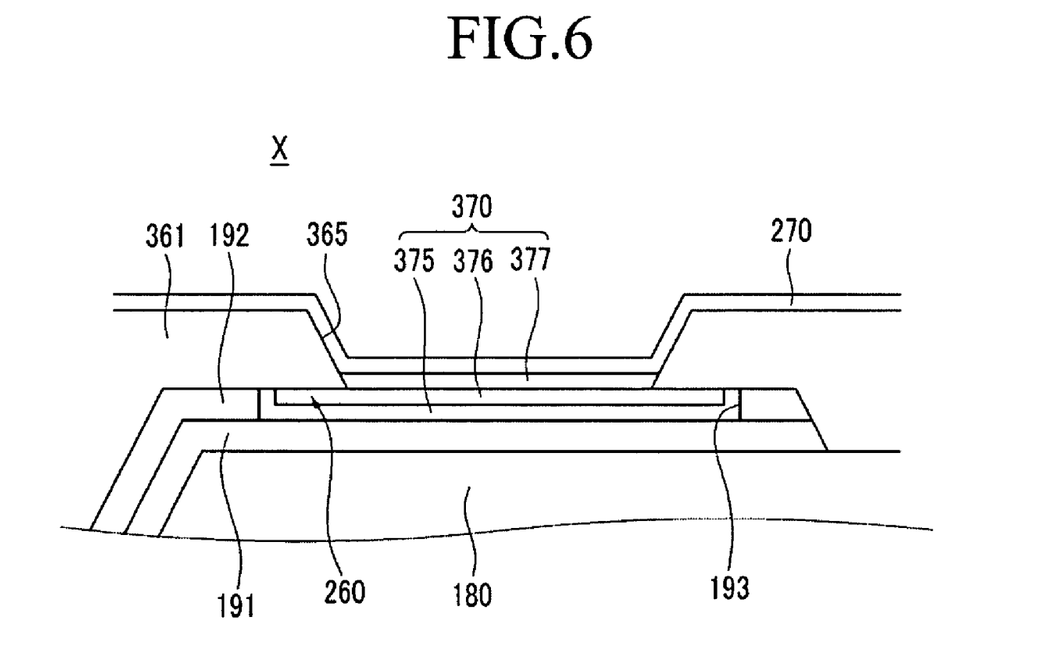
FIG. 6 and FIG. 7 are enlarged views of portion X of the organic light emitting device shown in FIG. 3.
Figure 7:
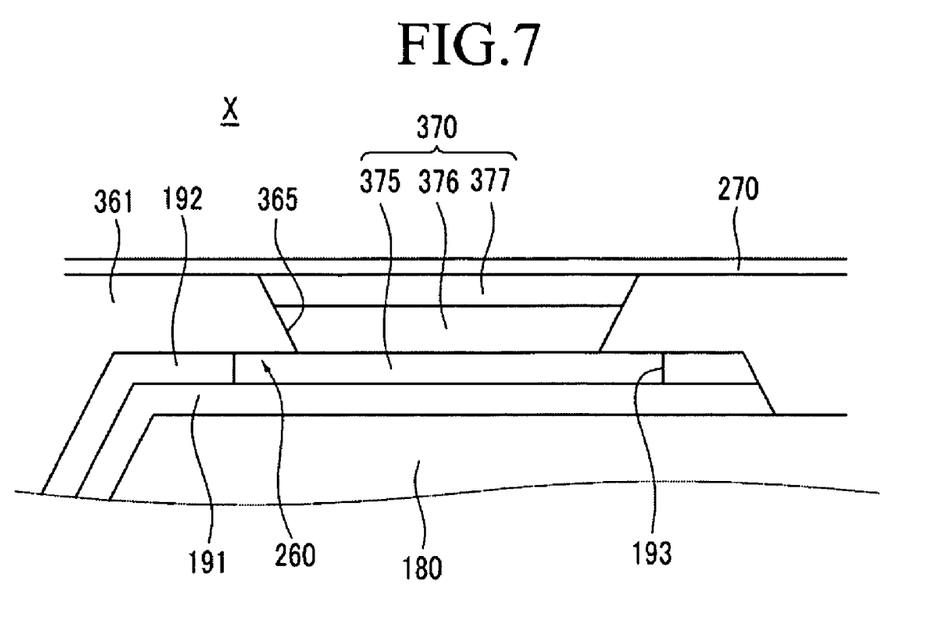

FIG. 5 is an enlarged view of one example of the X portion of the organic light emitting device shown in FIG. 3, and FIG. 6 and FIG. 7 are various examples of the enlarged view of portion X of the organic light emitting device shown in FIG. 3.

Referring to FIG. 5, the organic light emitting member 370 may have a multi-layered structure including the emission layer 376 and an auxiliary layer to improve efficiency of light emission of the emitting layer.

The emission layer 376 may be made of an organic material uniquely emitting light of one primary color, such as red, green, or blue, or a mixture of the organic material and the inorganic material. The organic light emitting device displays desired images by spatially combining the light of the primary colors emitted by the emission layer 376.

The auxiliary layer includes a hole transport layer 375 and an electron transport layer 377 to control the balance of electrons and holes. The auxiliary layer may additionally include an electron injection layer and a hole injection layer, as well as the hole transport layer 375 and the electron transport layer 377, to enhance the injection of electrons and holes. However, one layer may function as both the hole transport layer 375 and the hole injection layer, or may function as both the electron transport layer 377 and the electron injection layer.

The groove 193 of the second pixel electrode 192 includes a bottom surface and a side surface formed according to the circumference of the bottom surface. The bottom surface of the groove 193 is parallel to the passivation layer 180, and the side surface is a curved surface and its cross-section is substantially a semi-circle. However, as shown in FIG. 6, the side surface of the groove 193 may be perpendicular the bottom surface of the groove 193.

The edge of the groove 193 limits the gap 260 along with the partition 361. An interval d (the depth of the groove 193) between the lower surface of the partition 361 limiting the gap 260 and the bottom surface of the groove 193 may be in the range of about 5 nm to 200 nm. If the depth d of the groove 193 is less than 5 nm, it may be difficult for the hole transport layer 375 to be sufficiently filled, and if the depth d of the groove 193 is more than 200 nm, it may be difficult to etch the second pixel 192 to form the groove 193 and the material for forming the second pixel electrode 192 may be wasted.

The hole transport layer 375 is formed on the first pixel electrode 191 and in the groove 193 of the second pixel electrode 192. The edge of the hole transport layer 375 contacts the lower surface of the partition 361 limiting the gap 260. The thickness t of the hole transport layer 375 may be in the range of about 500 Å to 2000 Å. If the thickness t of the hole transport layer 375 is less than 500 Å or more than 2000 Å, the lifetime of the organic light emitting element may be reduced, and particularly, if the thickness t is more than 2000 Å, the transmittance may be decreased.

The emission layer 376 is formed on the hole transport layer 375. The emission layer 376 contacts the upper surface of the hole transport layer 375, and their edges contact the lower surface of the partition 361 limiting the gap 260. The upper surface of the emission layer 376 may be disposed on substantially the same plane as the lower surface of the partition 361 to limit the gap 260. In other words, the emission layer 376 may be positioned under the opening 365 of the partition 361, that is to say, inside the groove 193 of the second pixel electrode 192.

As a result, the hole transport layer 375 and the emission layer 376 may be wholly filled in the gap 260, and they may be filled through a capillary phenomenon. The emission layer 376 completely covers the hole transport layer 375 in the opening 365.

The electron transport layer 377 is formed on the emission layer 376. The electron transport layer 377 is disposed on the emission layer 376 to cover the hole transport layer 375 such that the electron transport layer 377 is spaced apart from the hole transport layer 375. The common electrode 270, which may be made of the metal such as magnesium (Mg) or silver (Ag), is formed on the electron transport layer 377.

According to this structure, the emission layer 376 is completely filled in the gap 260 such that the hole transport layer 375 and the electron transport layer 377 are physically and electrically separated from each other. Accordingly, a leakage current may be prevented and luminance deterioration may be prevented.

Also, the emission layer 376 is filled in the gap 260 such that the edge of the emission layer 376 is prevented from being thinly formed, and the central portion of the emission layer 376 is prevented from becoming convex. Accordingly, the surface of the emission layer 376 may be uniformly formed.

On the other hand, as shown in FIG. 7, only the hole transport layer 375 may be disposed in the groove 193 and the gap 260 of the second pixel electrode 192, and the emission layer 376 may be disposed in the opening 365 of the partition 361. In this case, the emission layer 376 completely covers the hole transport layer 375 in the opening 365, and the common electrode 270 may be formed on the partition 361 and the electron transport layer 377 without step coverage. The thickness of the hole transport layer 375 may be larger than the depth of the groove 193, and the surface is disposed on the opening 365 of the partition in this case.

Next, a manufacturing method of the organic light emitting device according to an exemplary embodiment of the present invention will be described with reference to FIG. 8, FIG. 9, FIG. 10, FIG. 11, FIG. 12, and FIG. 13.

Figure 8:
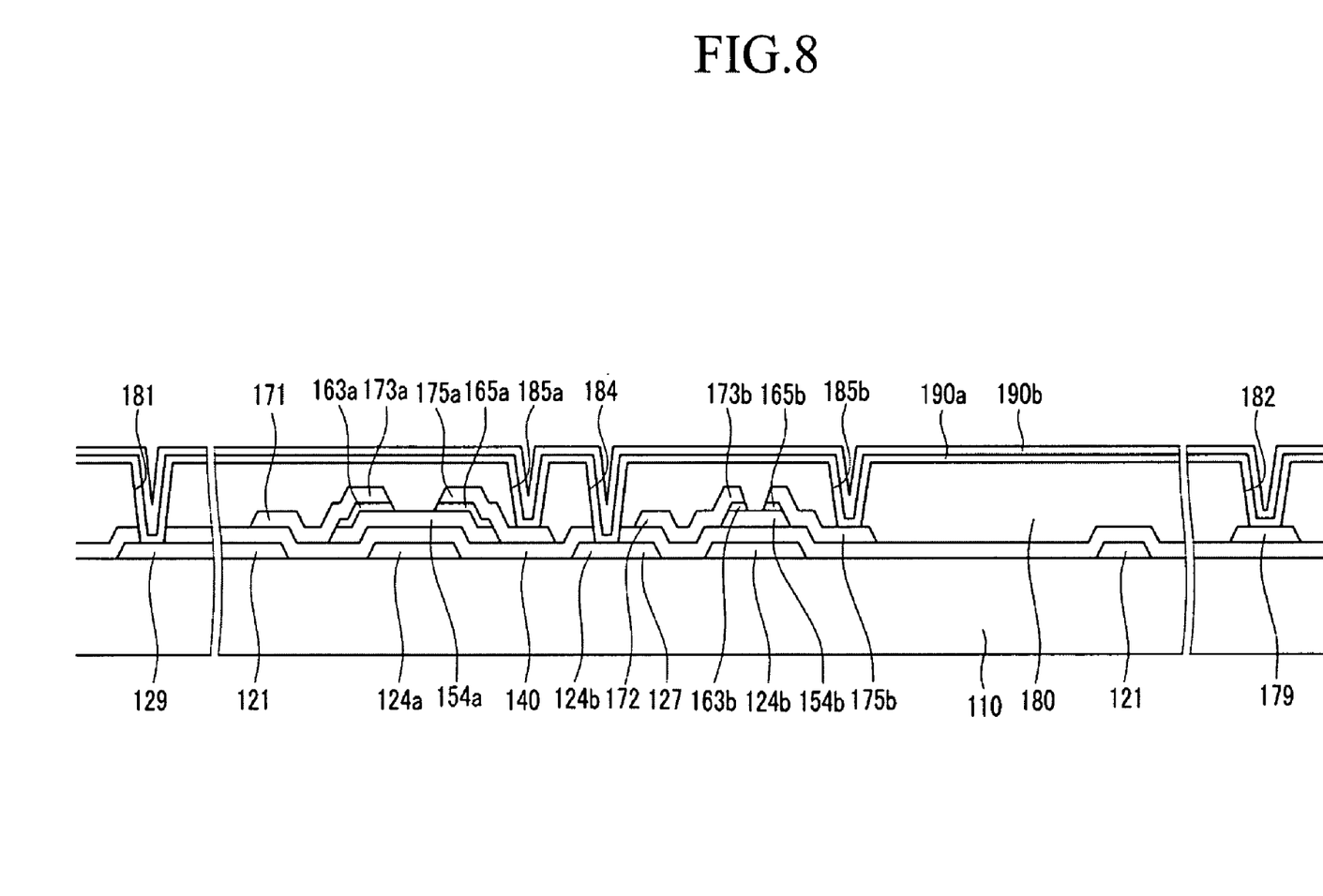
FIG. 8, FIG. 9, FIG. 10, FIG. 11, FIG. 12, and FIG. 13 are cross-sectional views sequentially showing a method of manufacturing the organic light emitting device according to an exemplary embodiment of the present invention.
Figure 9:
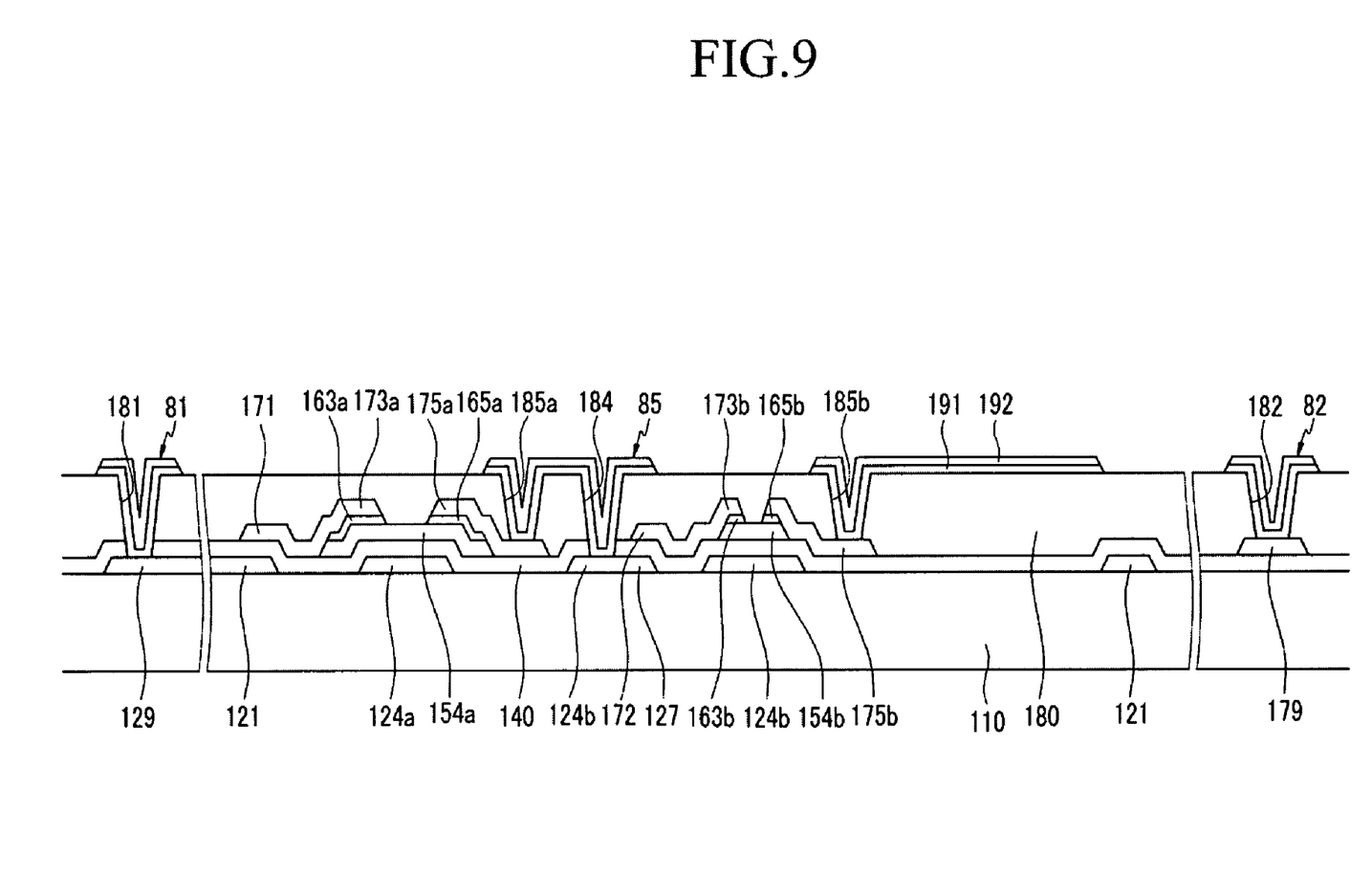
Figure 10:
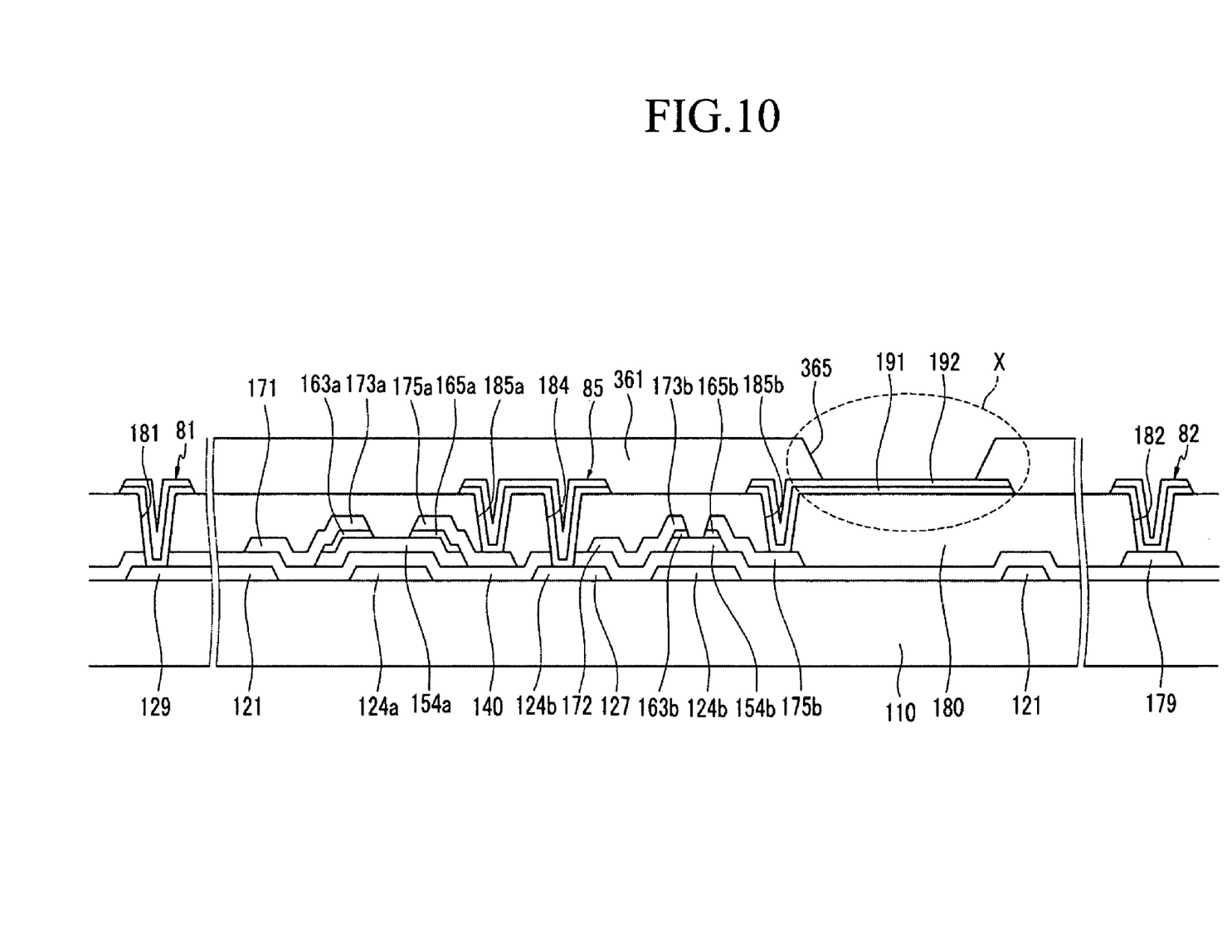
Figure 11:
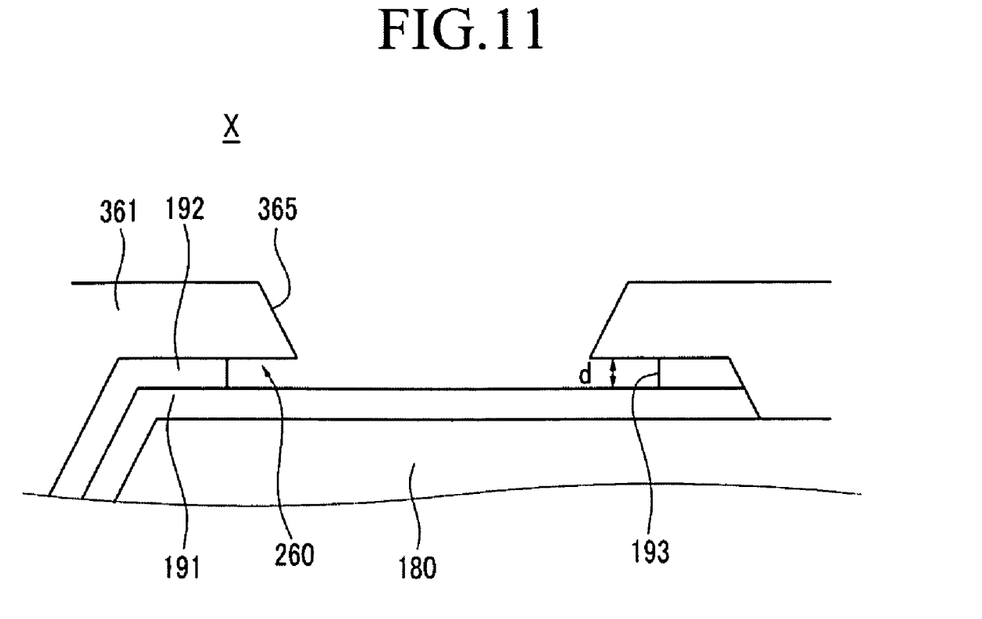
Figure 12:
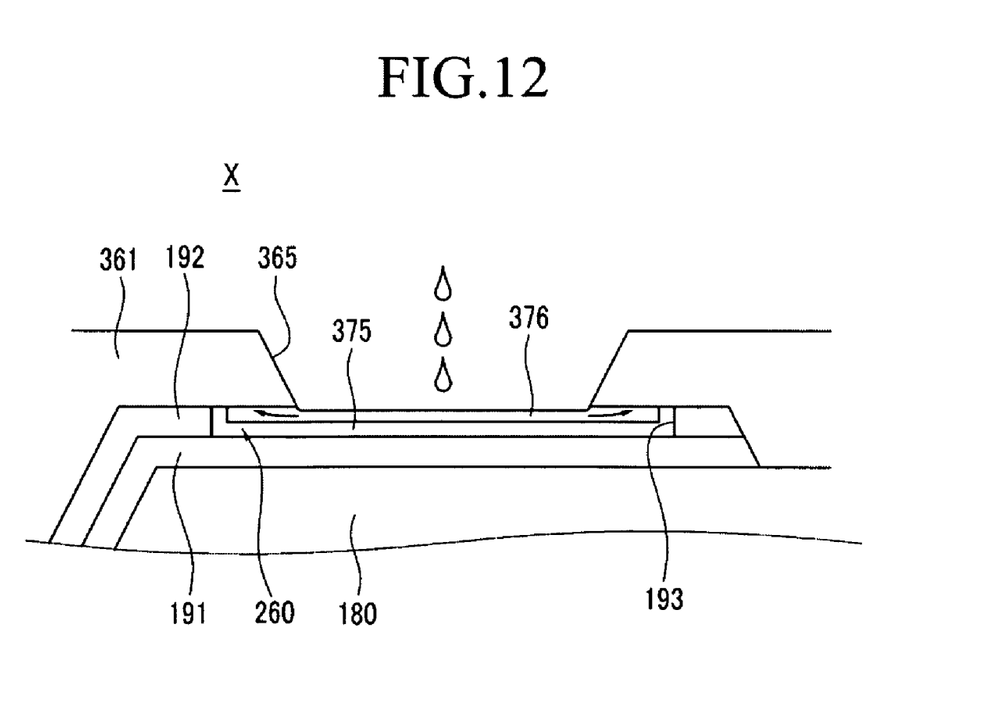
Figure 13:
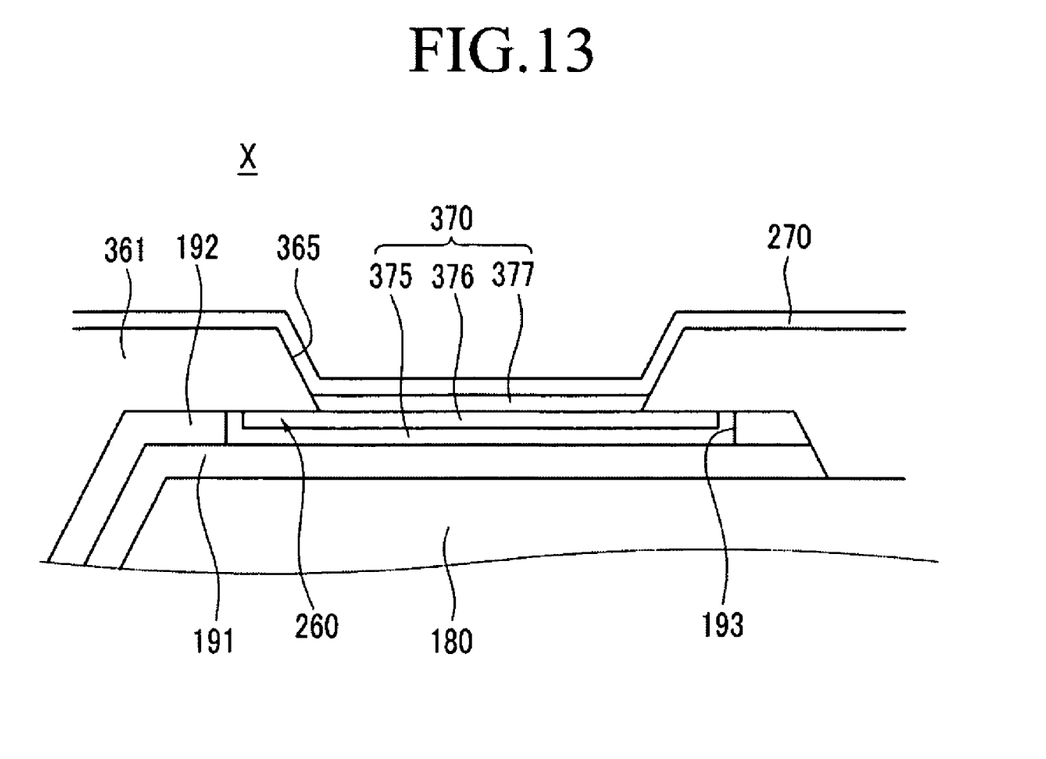

FIG. 8, FIG. 9, FIG. 10, FIG. 11, and FIG. 12 are cross-sectional views sequentially showing the method of manufacturing the organic light emitting device according to an exemplary embodiment of the present invention, and particularly FIG. 11, FIG. 12, and FIG. 13 are cross-sectional views enlarging portion X of FIG. 10.

First, as shown in FIG. 8, a gate conductor including a gate line 121, first and second control electrodes 124a and 124b, and a storage electrode 127, a gate insulating layer 140, first and second semiconductors 154a and 154b, first and second ohmic contacts 163a, 165a, 163b, and 165b, a data conductor including a data line 171, a driving voltage line 172, and first and second output electrodes 175a and 175b, and a passivation layer 180 are sequentially formed on the substrate 110. Next, an amorphous ITO layer 190a is deposited on the passivation layer 180, and an IZO layer 190b is deposited thereon.

As shown in FIG. 9, the amorphous ITO layer 190a, and the IZO layer 190b are etched to formed first and second pixel electrodes 191 and 192, and a connecting member 85 and contact assistants 81 and 82, which have a double-layered structure. Next, a heat treatment process such as an annealing process is executed to convert the lower layer, which includes the first pixel electrode 191, the connecting member 85, and the contact assistants 81 and 82 and which may be made of amorphous ITO, into a poly ITO. The amorphous ITO is damaged when etching it along with the IZO, but the poly ITO is not damaged when etching the IZO. As a result, the first pixel electrode 191 and the second pixel electrode 192 that experience the heat treatment process may have etch selectivity.

As shown in FIG. 10, an organic insulator layer or an inorganic insulator layer is formed on the passivation layer 180, the pixel electrode 191, and the connecting member 85. The insulating layer is then exposed and etched to form a partition 361 having an opening 365 exposing the second pixel electrode 192.

As shown in FIG. 11, the exposed portion of the second pixel electrode 192 that is not covered by the partition 361 is partially etched using the partitions 361 as an etching mask. Thus, the groove 193 exposing the portion of the first pixel electrode 191 is formed. Here, if wet etching is used, the second pixel electrode 192 is isotropically etched under the partition 361 such that an undercut is generated between the partition 361 and the second pixel electrode 192, thereby forming a gap 260. The size of the gap 260 is substantially the same as the thickness of the second pixel electrode 192, that is, the depth d of the groove 193, such that control may be easy. When etching the second pixel electrode 192, damage to the first pixel electrode 191 of poly ITO may be prevented.

On the other hand, the groove 193 may not pass through the second pixel electrode 192, and the shape of the cross-section of the gap 260 may be variously changed according to the conditions of the etch process.

In the case of the top emission device, a low resistance metal, such as copper, silver, or aluminum, is deposited on the partition 361, and patterned to form an auxiliary electrode 275 (referring to FIG. 4). Here, the etching of the metal layer may be simultaneously executed with the etch process to form the groove 193 of the second pixel electrode 192. The auxiliary electrode 275 may be omitted.

As shown in FIG. 12, an organic material is dripped in the groove 193 of the pixel electrode 191 through an inkjet method to form a hole transport layer 375. The hole transport layer 375 may be formed of a mixture of an organic material and an inorganic material. The organic material is filled in the gap 260 by a capillary phenomenon, and the organic material may have a uniform thickness according to the surface tension and the adhesion with the gap 260. Next, an organic material or a mixture of an organic material and an inorganic material to emit light is dripped on the hole transport layer 375 through an inkjet method to form an emission layer 376. The organic material or the mixture of the organic material and the inorganic material is filled in the gap 260 by a capillary phenomenon, and its end portion contacts the lower portion of the partition 361 limiting the gap 260. Accordingly, the emission layer 376 may have a uniform thickness according to the surface tension and the adhesion with the gap 260, and completely covers the hole transport layer 375.

On the other hand, as shown in FIG. 7, when the hole transport layer 375 is only disposed in the gap 260 and the groove 193, the emission layer 376 disposed thereon may be formed by a photolithography process. A hole injection layer may be additionally formed between the hole transport layer 375 and the pixel electrode 191.

As shown in FIG. 13, an electron transport layer 377 is formed on the emission layer 376, and a common electrode 270 is formed thereon. An electron injection layer may be formed between the electron transport layer 377 and the common electrode 270. The electron transport layer 377 and the electron injection layer may be formed by an inkjet method or a photolithography process.

According to this method, the emission layer 376 may be totally uniformly formed, and the emission layer 376 is spaced apart from the hole transport layer 375 and the electron transport layer 377, which may prevent a leakage current.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device, comprising:
    a substrate;
    a first pixel electrode disposed on the substrate;
    a second pixel electrode disposed on the first pixel electrode and having a groove;
    a partition disposed on the second pixel electrode and having an opening exposing the groove;
    an organic light emitting member, at least a portion of the organic light emitting member being disposed in the groove; and
    a common electrode disposed on the partition and the organic light emitting member,
    wherein the partition overlaps the groove to form a gap, and at least a portion of the organic light emitting member is disposed in the gap.

2. The organic light emitting device of claim 1, wherein:
    the first pixel electrode and the second pixel electrode are made of different materials.

3. The organic light emitting device of claim 2, wherein:
    the first pixel electrode is made of indium tin oxide.

4. The organic light emitting device of claim 3, wherein:
    the second pixel electrode is made of indium zinc oxide.

5. The organic light emitting device of claim 2, wherein:
    the groove passes through the second pixel electrode and exposes the first pixel electrode.

6. The organic light emitting device of claim 5, wherein:
    the depth of the groove is in the range of 5 nm to 200 nm.

7. The organic light emitting device of claim 2, wherein:
    the first pixel electrode has a multi-layered structure.

8. The organic light emitting device of claim 7, wherein:
    the first pixel electrode comprises:
    a first layer made of indium tin oxide (ITO);
    a second layer disposed on the first layer and made of a metal; and
    a third layer disposed on the second layer and made of ITO.

9. The organic light emitting device of claim 8, wherein:
    the second layer comprises aluminum.

10. The organic light emitting device of claim 8, further comprising:
    an auxiliary electrode disposed on the partition and made of a metal, the auxiliary electrode contacting the common electrode.

11. The organic light emitting device of claim 10, wherein:
    the auxiliary electrode comprises copper, silver, aluminum, or a combination thereof.

12. The organic light emitting device of claim 2, wherein:
    the organic light emitting member comprises a hole transport layer and an emission layer, and the hole transport layer comprises a portion disposed in the gap.

13. The organic light emitting device of claim 12, wherein:
    the emission layer comprises a portion disposed in the gap.

14. The organic light emitting device of claim 12, wherein:
    the thickness of the hole transport layer is in the range of 500 Å to 2000 Å.

15. The organic light emitting device of claim 12, further comprising:
    an electron transport layer disposed on the emission layer and on the opening of the partition.

16. A method for manufacturing an organic light emitting device, comprising:
    forming a first pixel electrode and a second pixel electrode on a substrate, the second pixel electrode comprising a different material from the material of the first pixel electrode and the second pixel electrode being disposed on the first pixel electrode;
    forming a partition having an opening on the second pixel electrode;
    etching the second pixel electrode to form a groove forming a gap under the partition;
    forming an organic light emitting member in the groove to fill at least a portion of the gap; and
    forming a common electrode on the organic light emitting member and the partition.

17. The method of claim 16, wherein forming the first pixel electrode and the second pixel electrode comprises:
    depositing an amorphous indium tin oxide (ITO) layer on the substrate;

depositing an indium zinc oxide (IZO) layer on the amorphous ITO layer;

etching the amorphous ITO layer and the IZO layer; and heat treating the etched amorphous ITO layer to covert it into a poly ITO layer.

18. The method of claim 17, further comprising:

depositing a metal layer on the partition; and etching the metal layer to form an auxiliary electrode.

19. The method of claim 18, wherein etching the second pixel electrode and etching of the metal layer are performed simultaneously.

20. The method of claim 16, wherein forming the first pixel electrode comprises:

depositing amorphous indium tin oxide (ITO) on the substrate;

depositing a metal layer on the amorphous ITO; and depositing amorphous ITO on the metal layer.

21. The method of claim 16, wherein forming the partition comprises:

depositing a photosensitive organic material layer or a photosensitive inorganic material layer on the second pixel electrode; and exposing and etching the material layer to form an opening exposing the second pixel electrode.

22. The method of claim 21, wherein:

the organic light emitting member is formed by an inkjet method.

23. The method of claim 22, wherein:

the organic light emitting member is filled in the gap by a capillary phenomenon.

24. The method of claim 16, wherein forming the organic light emitting member comprises:

depositing a hole transport layer on the second pixel electrode; and depositing an emission layer on the hole transport layer, wherein the hole transport layer fills the gap.

* * * * *